United States Patent [19]

Torelli et al.

[11] Patent Number: 4,587,441
[45] Date of Patent: May 6, 1986

[54] INTERFACE CIRCUIT FOR SIGNAL GENERATORS WITH TWO NON-OVERLAPPING PHASES

[75] Inventors: Guido Torelli, S. Alessio; Daniele Devecchi, Desio, both of Italy

[73] Assignee: SGS-ATES Componenti Elettronici S.p.A., Milan, Italy

[21] Appl. No.: 541,728

[22] Filed: Oct. 13, 1983

[30] Foreign Application Priority Data

Oct. 22, 1982 [IT]  Italy ............... 23869 A/82

[51] Int. Cl.$^4$ .............. H03K 3/353; H03K 3/017; H03K 5/156; H03K 5/05
[52] U.S. Cl. .................. 307/269; 307/246; 307/262; 307/265; 307/270; 307/578
[58] Field of Search ............. 307/262, 265, 268, 269, 307/270, 482, 578, 246, 475

[56] References Cited

U.S. PATENT DOCUMENTS

| | | | |
|---|---|---|---|
| 3,927,334 | 12/1975 | Callahan | 307/482 X |
| 3,961,269 | 6/1976 | Alvarez, Jr. | 307/262 X |
| 3,986,046 | 10/1976 | Wunner | 307/269 X |
| 4,230,951 | 10/1980 | Suzuki et al. | 307/269 X |
| 4,283,639 | 8/1981 | Roesler | 307/269 |
| 4,291,240 | 9/1981 | Rösler | 307/262 |
| 4,456,837 | 6/1984 | Schade, Jr. | 307/262 |

OTHER PUBLICATIONS

Cassidy et al., "Dynamic MOSFET Logic Clock Driver", IBM Tech. Discl. Bull.; vol. 22, No. 3, pp. 1093-1094; 8/79.

Primary Examiner—Larry N. Anagnos
Attorney, Agent, or Firm—Wenderoth, Lind & Ponack

[57] ABSTRACT

An interface circuit with MOS-type transistors for timing signal generators with two non-overlapping phases made up of two identical twin circuits, each having a final stage of the type including two transistors connected in series between the two terminals of a supply voltage generator and a bootstrap capacitor. Each of the two twin circuits includes a logic NOR circuit and a logic AND circuit which control, respectively, the charging and discharging of the capacitor through a suitable switching circuit connected to both terminals thereof. In each circuit, a memory circuit element is connected to the logic circuits. The memory circuit element is sensitive to the output signals of both twin circuits and enables the charging and discharging of the bootstrap capacitor at successive, logically produced time intervals which occur between the pulses of the output signals of both twin circuits.

13 Claims, 2 Drawing Figures

INTERFACE CIRCUIT FOR SIGNAL GENERATORS WITH TWO NON-OVERLAPPING PHASES

BACKGROUND OF THE INVENTION

The present invention relates to interface circuits for timing signal generators with two non-overlapping phases, having a rectangular-type pulse waveform. More particularly, it relates to an interface circuit with field-effect transistors with MOS-type insulated gates that can be used in integrated digital circuits with two-phase logic, e.g., in digital tuning systems for TV receivers. An interface circuit for such timing signal generators which is capable of being coded according to a binary logic scheme mainly has the function of uncoupling the user circuit which is controlled by the timing signals generated by the generator, in order to avoid reactions tending to modify the logic levels of the generated signals, and for supplying the necessary signal power required by the user circuit.

The interface circuits of the prior art which comprise field-effect transistors usually employ final stages that include a capacitor called "bootstrap capacitor" by those skilled in the art and which enables one to improve the time response of the system.

A final stage of this type can be simply formed by two transistors connected in series with the source and the drain electrodes between the two terminals of a supply voltage generator and having the gate electrodes coupled to an input terminal of the circuit which is connected to the timing signal generator by which they are switched on in phase opposition. The gate electrode of the transistor connected to the positive terminal is coupled to the junction point of the two transistors by means of a bootstrap capacitor.

The junction point of the two transistors constitutes an output terminal of the circuit. The gate electrode of the transistor which is connected to the negative terminal is coupled to the input terminal by means of an inverter circuit. Hence, the ON or OFF states of the transistor correspond to low or high input signal levels to which can be associated, respectively, the logic binary values 0 and 1 according to positive logic.

Between the source and the drain electrodes of a field-effect transistor there is virtually a short circuit in the ON state and an open circuit in the OFF state. Therefore, one can still associate, again according to "positive logic", a logic binary value 0 or 1, respectively, with the potential level of the output terminal corresponding to an input 0 or 1. Thus, the logic level of the input signal is properly transmitted to the output, and the output signal also turns out to be a pulse-type waveform. The use of a bootstrap capacitor permits a reduction in the rise time of the leading edges of the pulses of the output signal, whose waveform can thus better resemble an ideal rectangular-type waveform.

As a matter of fact, if the bootstrap capacitor is properly charged prior to a changeover from 0 to 1 of the input signal, then, when the occurrence of the leading edge of an input pulse causes the transistor connected to the negative terminal to be turned off and causes the output level to become equal to the potential of the positive terminal, the potential of the gate electrode of the transistor which is connected to the positive terminal is brought to a higher level than that which would permit the coupling with the input and with the supply voltage itself.

Without a bootstrap capacitor, the voltage supplied to the gate electrode of the transistor which is connected to the positive terminal would be constant. Therefore, simultaneously with the raising of the potential of the output terminal, or of the source electrode of the transistor, there would be a gradual reduction of the gate-source voltage supplied to the transistor and, hence, a reduction of its conductivity, which would delay the transient of the output rise with an exponential-type shape.

The bootstrap capacitor, on the other hand, keeps the gate-source voltage substantially constant and, thus, permits for all of the switching transients a rise rate of "1" of the substantially constant output. The capacitor must then be discharged so as to not impede the subsequent transition from 1 to 0.

Thus, an interface circuit which utilizes a bootstrap capacitor in the final stage or stages included therein must also have appropriate means in order to charge or discharge the capacitor without interfering with the proper logic operation of the circuit.

For timing signal generators with two non-overlapping phases with a rectangular-type pulse waveform, having two separate output terminals, an interface circuit is formed with MOS-type field-effect transistors. Such an interface circuit is known to those skilled in the art and satisfies such requirements. This circuit comprises two separate identical twin circuits, each having an input terminal for connection to the signal generator, and an output terminal for connection to a user circuit of such signals.

FIG. 1 shows one of such identical circuits which comprises a final stage formed by a first transistor, $Q_1$, and a second transistor, $Q_2$, respectively of the "enhancement" and the "depletion" type, and which are connected in series between the positive terminal, $+V_{CC}$, and the negative terminal, $-V_{CC}$ of a supply voltage generator.

The source electrode of $Q_1$ is connected to $-V_{CC}$ and the drain electrode of $Q_2$ is connected to $+V_{CC}$. The drain electrode of $Q_1$ and the source electrode of $Q_2$ are connected together in a circuit node which constitutes an output terminal $U_1$.

The circuit shown in the figure has an input terminal, A, for connection to a timing signal generator. Said terminal is connected to the gate circuit of $Q_1$ via a first inverter circuit, $I_1$, a second inverter circuit, $I_2$, and a third inverter circuit, $I_3$.

The gate electrode of $Q_2$ is connected to the output circuit node by means of a bootstrap capacitor, $C_1$.

The circuit comprises a third transistor, $Q_3$, and a fourth transistor, $Q_4$, respectively of the enhancement and the depletion type.

The source electrode of $Q_3$ is connected to $-V_{CC}$, the drain electrode of $Q_4$ is connected to $+V_{CC}$. The drain electrode of $Q_3$ and the source electrode of $Q_4$ are connected to a circuit node formed by the junction point between the gate electrode of $Q_2$ and the capacitor $C_1$.

The gate electrode of $Q_3$ is connected to the output of the first inverter circuit $I_1$; the gate electrode of $Q_4$ is connected to the output of a logic NOR circuit, $N_1$, having a first input which is connected to the input terminal A of the circuit by means of a fourth inverter circuit, $I_4$, and having a second input which is connected to the output of the second inverter circuit $I_2$.

Let us now consider in particular the operation of one of the twin circuits, the operation of the other being identical.

Assume, first, that the level of the input signal is low, that is, it corresponds to the logic value 0, and that $Q_1$ and $Q_3$ are switched on, the values of the outputs of $I_1$ and $I_3$ being equal to 1; in these conditions, the bootstrap capacitor $C_1$ is assuredly discharged and $Q_2$ is turned off; therefore, the potential level of the output corresponds to the logic value 0.

We observe that, since the value of the output of $I_4$ is 1, the output of the logic circuit $N_1$ must, of necessity, also be 0; therefore, $Q_4$ is also conducting very little (i.e., it has the lowest conductivity that can be achieved with the source electrode at 0 and the gate electrode at a non-negative potential), and $C_1$ cannot be charged.

When the level of the input signal switches to the logic value 1 upon the appearance of the leading edge of a pulse, the outputs of $I_1$ and $I_4$ fall simultaneously to the 0 level.

Since the output level of $I_2$ rises to 1 only after a certain time interval, due to analogic delays of the inverter circuit, during all this time interval, both inputs of the NOR circuit, $N_1$, have the logic value 0. Thus, the output takes on the value 1 and brings about the conduction of $Q_4$ for said period of time.

Since $Q_3$ is already turned off and since the output is still at 0, the bootstrap capacitor $C_1$ is charged through $Q_4$ to a voltage close to that of the supply voltage.

As soon as the output of $I_2$ rises to 1, $N_1$ turns off $Q_4$, but $C_1$ remains charged, since $Q_3$ continues to turn off.

With a given delay, the output of $I_3$ drops to the 0 level, turning off $Q_1$. The potential level of the circuit output starts to rise, raising at the same time the gate potential of $Q_2$ beyond the level of $+V_{CC}$ by means of the bootstrap capacitor, which keeps the gate-source voltage $Q_2$ substantially constant.

Since the conductivity of a depletion-type transistor, having a negative threshold voltage, is essentially higher upon increasing the positive voltage supplied to the gate, the potential of the output $U_1$ of the circuit rises to the 1 level with a very brief transient. Then, upon the occurrence of the trailing edge of the signal pulse, the input A switches to 0, the outputs of $I_1$ and $I_4$ rise simultaneously to 1, bringing about the conduction of $Q_3$, which permits the unloading of $C_1$ and the turn-off of $Q_2$, and confirming the 0 value of the output of the NOR circuit which causes $Q_4$ to remain turned off. With a given delay, due to similar delays of $I_2$ and $I_3$, whose outputs change over to, respectively, 0 and 1, $Q_1$ is turned on and the potential of the output $U_1$ drops to the 0 level, restoring the initial conditions.

The prior art interface circuit described in FIG. 1 ensures a rapid switching of the output, thus producing signal pulses having a shape which closely resembles rectangular-type pulses.

However, the presence of several serially connected circuits produces non-negligible signal delays between their inputs and outputs. Moreover, since the time available for the charging of the bootstrap capacitor is very brief, which is effected by making use of analogic delay in the inverter circuits, high load-current levels are needed with more expensive sizing of the circuit components.

More noise and a greater heat dissipation correspond to higher current flows in the metal connections and in the junctions of the integrated device. Precisely because of such considerable heat dissipation, the high-frequency operating temperature, which often approaches or exceeds the levels at which the junctions deteriorate or are destroyed, causes the reliability of the device to quickly diminish.

SUMMARY OF THE INVENTION

The object of the present invention is to create an interface circuit for timing signal generators with two non-overlapping phases, having a rectangular-type pulse waveform which produces signal delays of shorter duration than those of the interface circuits known in the prior art and which is more economical and reliable compared thereto.

This object is achieved with the interface circuit for timing signal generators with two non-overlapping phases as defined and characterized in the claims at the end of this description.

BRIEF DESCRIPTION OF THE DRAWINGS

The invention will be better understood from the following detailed description given solely by way of non-limitative example, with reference to the accompanying drawings, in which.

DESCRIPTION OF THE PREFERRED EMBODIMENT

Figure 1:
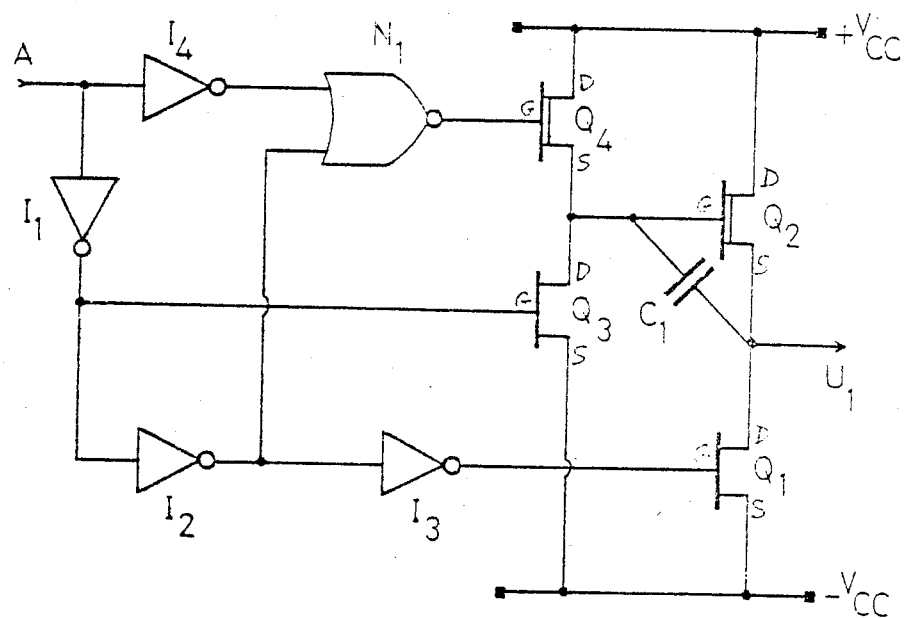
FIG. 1 is the diagram of one of the two separate identical circuits which together form an interface circuit known in the prior art for timing signal generators with two non-overlapping phases.

In the figures, like reference characters and numerals designate like parts throughout the several views.

The interface circuit shown in FIG. 2 can be designed as an integrated circuit with insulated gate and "n" channel MOS-type field-effect transistors and it can be a part of a more complex integrated circuit which will not be discussed hereinafter.

Figure 2:
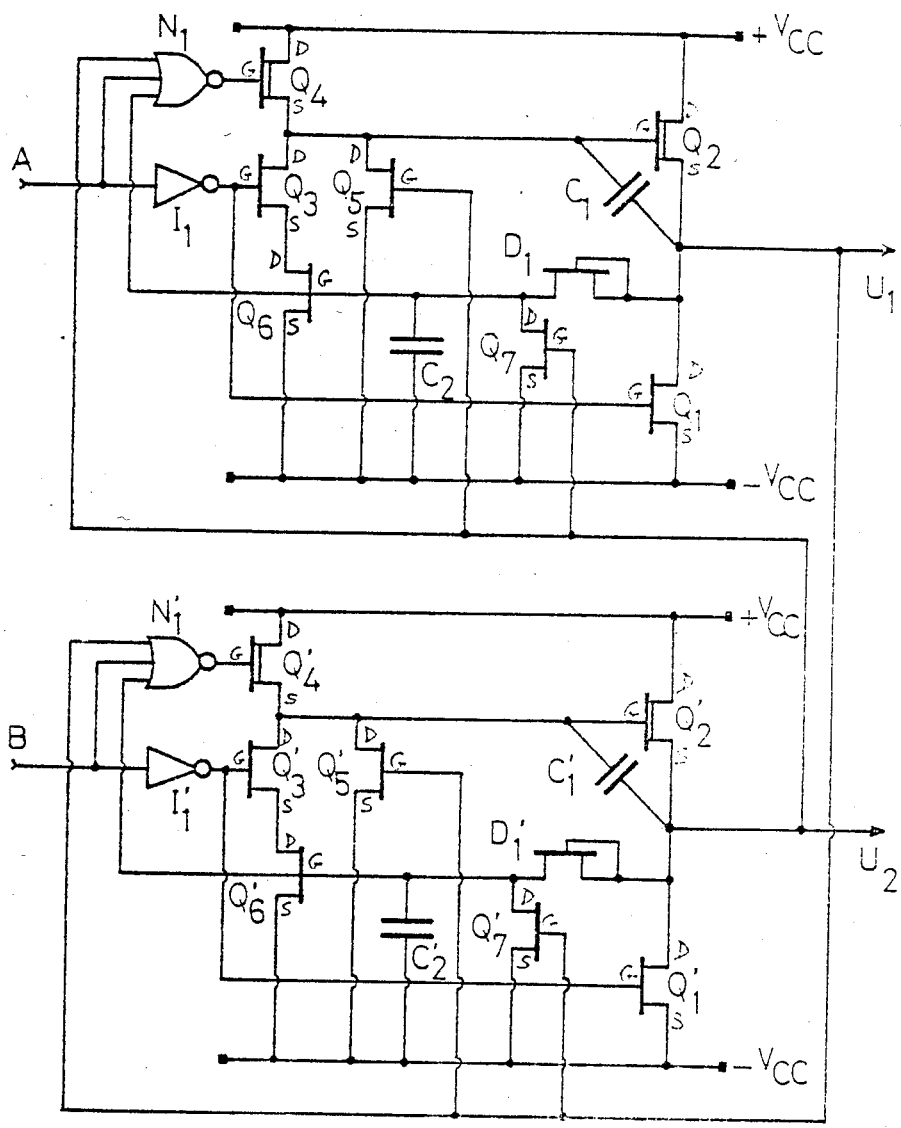
FIG. 2 is the complete diagram of an interface circuit for timing signal generators with two non-overlapping phases embodying the principles of the present invention.

The circuit in FIG. 2 is formed by a first circuit, having an input terminal A and an output terminal $U_1$, and a second circuit which is identical to the first, having an input terminal B and an output terminal $U_2$.

For the sake of convenience, only one of said identical twin circuits will be described, the connections therebetween being furthermore symmetrical.

This twin circuit comprises a final stage formed by a first transistor, $Q_1$, and a second transistor, $Q_2$ of, respectively, the enhancement type and the depletion type.

The source electrode of $Q_1$ is connected to the $-V_{CC}$ terminal of a supply voltage generator; the drain electrode of $Q_2$ is connected to the second $+V_{CC}$ terminal of the supply voltage generator.

The drain electrode of $Q_1$ and the source electrode of $Q_2$ are connected together in a circuit node formed by the output terminal $U_1$ of the circuit. The gate electrode of $Q_2$ is connected to said circuit node by means of a capacitor $C_1$ used as the bootstrap capacitor of the final stage.

This circuit also has a third transistor, $Q_3$, and a fourth transistor, $Q_4$ of, respectively, the enhancement type and the depletion type. The drain electrode $Q_3$ and the source electrode of $Q_4$ are connected to the gate electrode of $Q_2$, which is also connected to the drain electrode of a fifth transistor, $Q_5$, of the enhancement type. The drain electrode of $Q_4$ and the source electrode of $Q_5$ are connected respectively to $+V_{CC}$ and $-V_{CC}$.

The source electrode of $Q_3$ is connected to the drain electrode of a sixth transistor, $Q_6$, of the enhancement type, whose source electrode is connected to $-V_{CC}$.

The gate electrodes of $Q_1$ and of $Q_3$ are coupled to the input terminal A through an inverter circuit, $I_1$.

The gate electrode of $Q_6$ is connected to a terminal of a second capacitor, $C_2$, whose second terminal is connected to $-V_{CC}$.

The first terminal of $C_2$ is also connected to the output terminal $U_1$ via a transistor, $Q_7$, which is connected to a diode, $D_1$; the diode $D_1$ is connected to the drain electrode of the seventh transistor, $Q_7$, which is of the enhancement type, and whose source electrode is connected to $-V_{CC}$ and to a first input terminal of a logic NOR circuit, $N_1$. The output of said logic NOR circuit $N_1$ is connected to the gate electrode of $Q_4$; a second and a third input of $N_1$ are connected, respectively, to the input terminal A of the circuit and to the output terminal, $U_2$, of the twin circuit.

The gate electrodes of $Q_5$ and $Q_7$ are also connected to the output terminal $U_2$ of the twin circuit. The corresponding components of the twin circuit, which is identical to the first and is connected thereto, are denoted in FIG. 2 by the same reference characters and numerals, but are primed.

Let us now explain in particular the operation of the interface circuit of the present invention, as shown in FIG. 2, with reference to only one of the two twin circuits, the operation of each being identical and the connection therebetween being symmetrical.

Transistors $Q_1$ and $Q_2$ with capacitor $C_1$ form a final stage with a bootstrap capacitance of the type known in the prior art described above.

However, while the gate electrode of $Q_1$ is normally coupled to the input terminal by means of an inverter circuit, the gate circuit of $Q_2$ is coupled via suitable logic circuits not only to the input terminal A of the circuit, but also to the output $U_2$ of the twin circuit and to a memory element formed by the capacitor $C_2$ and which is sensitive to the outputs $U_1$ and $U_2$ of the two twin circuits.

Capacitor $C_2$ is charged when the potential of the output terminal $U_1$, to which it is connected by means of diode $D_1$, changes over to 1, that is to say, when $Q_1$ is turned OFF and $Q_2$ is ON.

However, through diode $D_1$, capacitor $C_2$ can be discharged only when $Q_7$ is switched on, or when the output $U_2$ has a value 1, this being independent of the possible transitions of $U_1$. Therefore, $C_2$ is charged upon the occurrence of the leading edge of each signal pulse at the output $U_1$ and remains charged up to the leading edge of the next signal pulse at the output $U_2$.

The charging of $C_1$ can only occur through $Q_4$ when the latter is conducting, whereas the discharging of $C_1$ can only take place through $Q_3$ and $Q_6$ when these are ON at the same time.

Transistor $Q_4$ is ON only when capacitor $C_2$ is discharged, while being coupled to said capacitor through the logic NOR circuit, $N_1$.

Transistor $Q_6$ is ON only when $C_2$ is charged, so $Q_4$ and $Q_6$ can never be simultaneously in the state of maximum conduction and, hence, the non-contemporaneousness of the charging and discharging of $C_1$ is assured.

Transistor $Q_4$ is also coupled, via the NOR circuit, to the input terminal A and to the output terminal $U_2$ of the twin circuit. Therefore, the latter can conduct and, hence, it permits the charging of $C_1$ and the turn-on of $Q_1$ only when all of the inputs of the NOR circuit have the value 0, or only during the internal of time between the trailing edge of each signal pulse at an output $U_2$ and the leading edge of each succeeding signal pulse at input A.

Transistor $Q_3$ is turned on at the same time as $Q_1$ by the input signals which have been inverted by the inverter circuit $I_1$. Therefore, the discharging of $C_1$ through $Q_3$ and $Q_6$ (and the turnoff of $Q_2$) occurs when, at the same time, the input signal has the value 0 and the capacitor $C_2$ is charged. Hence, the discharging of $C_1$ occurs only during the interval of time between the trailing edge of each signal pulse at the input A and the trailing edge of each succeeding signal pulse at the output $U_2$. It can be observed how the function developed together by $Q_3$ and $Q_6$ is identical to that which might be developed by a single transistor but controlled by a logic AND circuit having two inputs connected to $I_1$ and $C_2$.

Thereafter, transistor $Q_5$ keeps $C_1$ discharged and $Q_2$ turned off until the output $U_2$ reaches the value 1, that is, until the time when the next charging of $C_1$ can be initiated.

The interface circuit shown in FIG. 2 transmits the input signal to the output with a delay which is of a shorter duration than that introduced by the prior art circuit depicted in FIG. 1. In fact, the gate electrode of $Q_1$ is coupled to the input terminal A by means of a single inverter circuit.

The citcuit of the present invention uses time intervals for the charging and discharging of the bootstrap capacitance which are produced logically by the circuit so as to be able to take advantage of all the time available between the signal pulses without in any way interfering therewith.

More particularly, the time intervals available for the charging are much longer than those achieved by the prior art circuit with analogic delays in inverter circuits (e.g., for signal frequencies of 250 KHz the time intervals are 500 nanoseconds instead of 30 to 40 nanoseconds) and their duration is adaptd to the pulse frequency.

Greater reliability and less noise result, so that lower load current levels can be achieved.

Furthermore, the reduction of the current levels in the circuit permits better sizing of the components and of the necessary power, leading to greater economy for the resulting devices which are all integrated into a single chip by the integration techniques which are known in the prior art.

While the present invention has been illustrated and described in conjunction with a particular embodiment, it is readily apparent that numerous modifications are possible without departing from the scope of the invention.

For example, the transistors of the depletion type and the bootstrap capacitor may be replaced by equivalent devices of the enhancement type. In another approach, all of the transistors may be of the "p"-channel type.

What is claimed is:

1. An interface circuit for use with a pair of timing signals with two non-overlapping phases and having rectangular pulse waveforms, said circuit comprising a pair of identical circuits with field-effect transistors, each identical circuit having an input terminal for connection to one of said pair of timing signals and having an output terminal for connection to a user circuit, each circuit of said pair of identical circuits having a final stage comprising:

a first transistor having source, drain, and gate electrodes and a second transistor having source, drain, and gate electrodes, said source electrode of said first transistor being connected to a first terminal of a supply voltage generator, and said drain electrode of said second transistor being connected to a second terminal of said supply voltage generator, said drain electrode of said first transistor being connected to said source electrode of said second transistor such that the junction point of said first and second transistors constitute said output terminal of said circuit, said gate electrode of said first transistor being coupled to the input terminal of said circuit by means of an inverter circuit, said gate electrode of said second transistor being coupled to said junction point of said first and second transistors by means of a capacitive circuit element and connected, by means of a first switching circuit means, to said second terminal of said supply voltage generator and, by means of a second switching circuit means, to said first terminal of said supply voltage generator;

wherein each of said pair of identical circuits comprises:

a logic NOR circuit means operatively connected to said first switching circuit means for controlling said first switching circuit means;

an AND logic circuit means operatively connected to said second switching circuit means for controlling said second switching circuit means;

said AND logic circuit means comprising a memory element which is responsive to and indicative of said output signals from said pair of identical circuits and which, upon an occurrence of a leading edge of each of said rectangular pulses of said output signals from said pair of identical circuits, stores the level of the output signal of its associated circuit, transmitting a signal up to an occurrence of a leading edge of a subsequent rectangular output pulse signal of said output signals from said pair of identical circuits, said transmitted signal having a constant level equal to said stored level, said transmitted signal from said memory element being fed to a first input terminal of said NOR logic circuit and to a first input terminal of said logic AND circuit;

said logic NOR circuit having a second and a third input terminal connected to, respectively, said input terminal of its associated circuit and to the output terminal of that circuit of said pair of identical circuits other than its associated circuit;

said logic AND circuit having a second input terminal coupled by means of said inverter circuit to said input terminal to its associated circuit.

2. An interface circuit as claimed in claim 1, wherein said memory element included in at least one circuit of said pair of identical circuits comprises a capacitor, having a first terminal connected to said first terminal of said supply voltage generator and having a second terminal connected to said first input terminal of said logic NOR circuit and to said first input terminal of said logic AND circuit, and to said output terminal of its associated circuit through a diode and to said first terminal of said supply voltage generator through a third transistor having source, drain, and gate electrodes, said source and drain electrodes of said third transistor being respectively connected between said second terminal of said capacitor and said first terminal of said supply voltage generator and said gate electrode of said third transistor being connected to said output terminal of that circuit of said pair of identical circuits other than its associated circuit.

3. An interface circuit as claimed in claim 2, wherein each of said transistors comprise n channel MOS-type insulated gate field-effect transistors, wherein said transistors having an electrode which is connected directly to said second terminal of said supply voltage generator being of a depletion type and said other transistors being of an enhancement type.

4. An interface circuit as claimed in claim 2, wherein each of said capacitive circuit elements comprises a capacitor.

5. An interface circuit as claimed in claim 1, wherein each of said capacitive circuit elements comprises a capacitor.

6. An interface circuit as claimed in claim 5, wherein each of said transistors comprise n channel MOS-type insulated gate field-effect transistors, wherein said transistors having an electrode which is connected directly to said second terminal of said supply voltage generator being of a depletion type and said other transistors being of an enhancement type.

7. An interface circuit as claimed in claim 1, wherein said first switching circuit means comprises a third transistor having source and drain electrodes which are respectively connected to said gate electrode of said second transistor and said second terminal of said supply voltage generator and having a gate electrode which is coupled to said logic NOR circuit which drives said third transistor into its conducting state.

8. An interface circuit as claimed in claim 7, wherein each of said transistors comprise n channel MOS-type insulated gate field-effect transistors, wherein said transistors having an electrode which is connected directly to said second terminal of said supply voltage generator being of a depletion type and said other transistors being of an enhancement type.

9. An interface circuit as claimed in claim 7, wherein said logic AND circuit and said second switching circuit means included in at least one of said pair of identical circuits are together formed by a fourth and a fifth transistor having gate electrodes which respectively form said first and second input terminal of said logic AND circuit, said fourth and fifth transistors having respective source and drain electrodes, said source electrode of said fifth transistor being connected to said drain electrode of said fourth transistor, and said drain electrode of said fifth transistor being connected to said gate electrode of said second transistor and said source electrode of said fourth transistor being connected to said first terminal of said supply voltage generator.

10. An interface circuit as claimed in claim 9, wherein at least one of said pair of identical circuits includes a sixth transistor having drain and source electrodes which are respectively connected to said gate electrode of said second transistor and said first terminal of said supply voltage generator, and having a gate electrode which is connected to said output terminal of that circuit of said pair of identical circuits other than its associated circuit.

11. An interface circuit as claimed in claim 10, wherein each of said transistors comprise n channel MOS-type insulated gate field-effect transistors, wherein said transistors having an electrode which is connected directly to said second terminal of said supply voltage generator being of a depletion type and said other transistors being of an enhancement type.

12. An interface circuit as claimed in claim 9, wherein each of said transistors comprise n channel MOS-type insulated gate field-effect transistors, wherein said transistors having an electrode which is connected directly to said second terminal of said supply voltage generator being of a depletion type and said other transistors being of an enhancement type.

13. An interface circuit as claimed in claim 1, wherein each of said transistors comprise n channel MOS-type insulated gate field-effect transistors, wherein said transistors having an electrode which is connected directly to said second terminal of said supply voltage generator being of a depletion type and said other transistors being of an enhancement type.

* * * * *